(12) United States Patent
Bryngelsson et al.

(10) Patent No.: US 10,259,338 B2
(45) Date of Patent: Apr. 16, 2019

(54) METHOD AND SYSTEM FOR OPTIMIZING THE LIFETIME OF AN ENERGY STORAGE SYSTEM

(71) Applicant: VOLVO TRUCK CORPORATION, Göteborg (SE)

(72) Inventors: Hanna Bryngelsson, Göteborg (SE); Niklas Legnedahl, Onsala (SE); Christopher D. Rahn, University Park, PA (US); Tanvir Tanim, University Park, PA (US)

(73) Assignee: Volvo Truck Corporation, Göteborg (SE)

( * ) Notice: Subject to any disclaimer, the term of this patent is extended or adjusted under 35 U.S.C. 154(b) by 0 days.

(21) Appl. No.: 15/735,008

(22) PCT Filed: Jun. 10, 2015

(86) PCT No.: PCT/EP2015/062946
§ 371 (c)(1),
(2) Date: Dec. 8, 2017

(87) PCT Pub. No.: WO2016/198103
PCT Pub. Date: Dec. 15, 2016

(65) Prior Publication Data
US 2018/0162232 A1   Jun. 14, 2018

(51) Int. Cl.
*B60L 11/18* (2006.01)
*B60L 9/00* (2019.01)
(Continued)

(52) U.S. Cl.
CPC ............. *B60L 11/1875* (2013.01); *B60L 9/00* (2013.01); *B60L 11/02* (2013.01);
(Continued)

(58) Field of Classification Search
CPC   B60L 9/00; B60L 11/02; B60L 11/18; H01M 10/42; H01M 10/44; H02J 7/00; H02J 7/04
(Continued)

(56) References Cited

U.S. PATENT DOCUMENTS

| 5,767,659 A * | 6/1998 | Farley | H01M 10/46 320/106 |
| 7,449,891 B2 * | 11/2008 | Cawthorne | B60W 10/26 320/132 |

(Continued)

FOREIGN PATENT DOCUMENTS

| JP | 08140274 A | 5/1996 |
| JP | 2002343448 A | 11/2002 |

(Continued)

OTHER PUBLICATIONS

International Search Report (dated Mar. 31, 2016) for corresponding International App. PCT/EP2015/062946.
(Continued)

*Primary Examiner* — Tan Q Nguyen
(74) *Attorney, Agent, or Firm* — WRB-IP LLP

(57) ABSTRACT

A method is provided for optimizing the operating lifetime of an energy storage system including a battery pack with a plurality of battery cells. The method includes: measuring the temperature of the battery pack by means of a sensor unit; and measuring at least one further parameter representing an indication of the operating lifetime of the battery pack. Furthermore, the method includes the steps of: detecting whether the parameter reaches a predetermined threshold value indicating that the battery pack is in a condition close to an end of its expected operating lifetime; and, in the event that the threshold value is reached, initiating heating of the battery pack, thereby increasing the temperature of the battery pack to a predetermined value so as to prolong the (Continued)

operating lifetime of the battery pack. A system for optimizing the operating lifetime of an energy storage system is also provided.

8 Claims, 3 Drawing Sheets

(51) Int. Cl.
*B60L 11/02* (2006.01)
*H02J 7/00* (2006.01)
*H02J 7/04* (2006.01)
*H01M 10/48* (2006.01)
*H01M 10/625* (2014.01)
*H01M 10/615* (2014.01)
*H01M 10/651* (2014.01)
*H01M 10/42* (2006.01)

(52) U.S. Cl.
CPC ....... *B60L 11/1857* (2013.01); *B60L 11/1861* (2013.01); *B60L 11/1864* (2013.01); *H01M 10/48* (2013.01); *H01M 10/615* (2015.04); *H01M 10/625* (2015.04); *H01M 10/651* (2015.04); *H02J 7/0057* (2013.01); *H02J 7/0075* (2013.01); *H02J 7/047* (2013.01); *B60L 2200/18* (2013.01); *B60L 2240/36* (2013.01); *B60L 2240/545* (2013.01); *B60L 2240/547* (2013.01); *B60L 2260/44* (2013.01); *B60L 2260/50* (2013.01); *H01M 2220/20* (2013.01); *Y02T 10/70* (2013.01); *Y02T 10/7005* (2013.01); *Y02T 10/7061* (2013.01); *Y02T 10/7077* (2013.01); *Y10S 903/907* (2013.01)

(58) Field of Classification Search
USPC .......................................................... 701/22
See application file for complete search history.

(56) References Cited

U.S. PATENT DOCUMENTS

| 9,553,465 B2* | 1/2017 | Raghavan | H02J 7/0052 |
| 2007/0210769 A1 | 9/2007 | Tsutsumi et al. | |
| 2012/0261397 A1 | 10/2012 | Schwarz et al. | |
| 2013/0166119 A1 | 6/2013 | Kummer et al. | |
| 2014/0002031 A1* | 1/2014 | Chaturvedi | H01M 10/44 |
| | | | 320/152 |
| 2015/0338468 A1* | 11/2015 | Kaiya | H02J 7/00 |
| | | | 324/432 |

FOREIGN PATENT DOCUMENTS

| JP | 2008042960 A | 2/2008 |
| WO | 2011122946 A2 | 10/2011 |

OTHER PUBLICATIONS

Japanese Official Action (dated Jan. 21, 2019) for corresponding Japanese App. 2017564030.

* cited by examiner

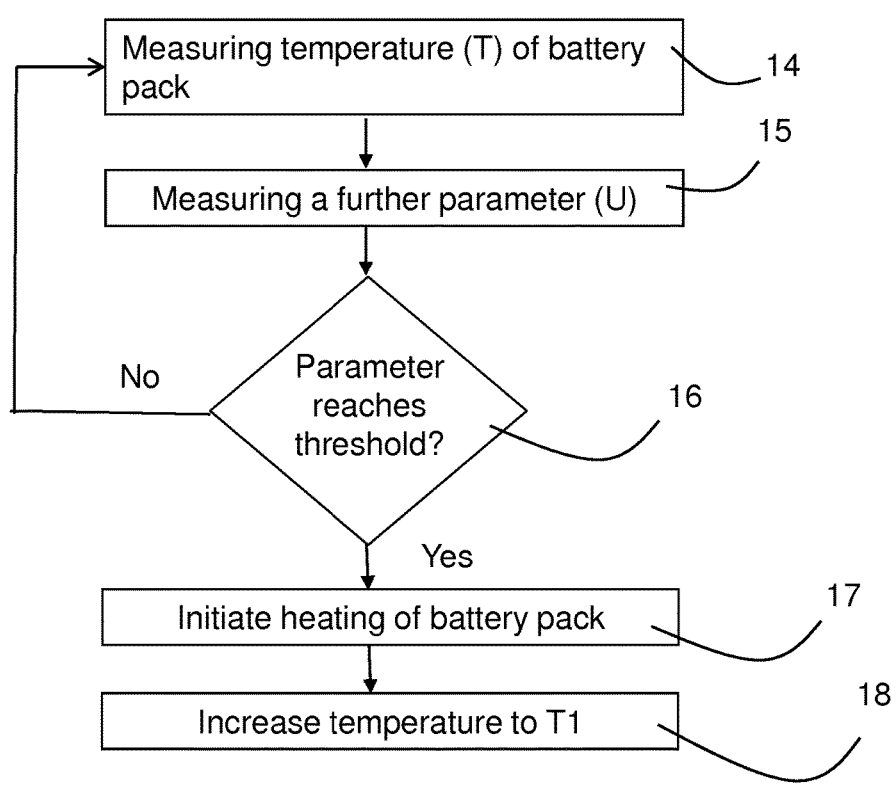

METHOD AND SYSTEM FOR OPTIMIZING THE LIFETIME OF AN ENERGY STORAGE SYSTEM

BACKGROUND AND SUMMARY

The present invention relates to a method for optimizing the operating lifetime of an energy storage system comprising a battery pack with a plurality of battery cells, said method comprising: measuring the temperature of the battery pack by means of a sensor unit and measuring at least one further parameter representing an indication of the operating lifetime of the battery pack.

The invention also relates to a system for optimizing the operating lifetime of an energy storage system comprising a battery pack with a plurality of battery cells, said system comprising a sensor unit for measuring the temperature of the battery pack and at least one further parameter representing an indication of the operating lifetime of the battery pack.

The invention can be applied in heavy-duty vehicles, such as trucks, buses and construction equipment. Although the invention will be described with respect to a bus, the invention is not restricted to this particular vehicle, but may also be used in other vehicles such as cars and working machines such as articulated haulers, excavators and backhoe loaders, and furthermore also boats and industrial applications in which batteries are used.

In the field of vehicles, there is a steady increase in research and development related to propulsion of vehicles with alternative power sources, i.e. power sources being used as alternatives to conventional internal combustion engines. In particular, electrically operated vehicles has emerged as a promising alternative.

According to today's technology, a vehicle can be operated by means of an electric machine solely or by means of an arrangement comprising both an electric machine and an internal combustion engine. The latter alternative is often referred to as a hybrid vehicle (HEV), and can for example be utilized in a manner in which an internal combustion engine is used for operating the vehicle while driving outside urban areas whereas the electric machine can be used in urban areas or in environments in which there is a need to limit the discharge of harmful pollutants such as for example carbon monoxide and oxides of nitrogen.

The technology involved in electrically operated vehicles is closely related to the development of electrical energy storage systems, such as battery-related technology for vehicles. Today's electrical energy storage systems for vehicles may comprise a battery pack with a plurality of rechargeable battery cells which, together with control circuits, form a system which is configured for providing electric power to an electric machine in a vehicle.

A vehicle which is operated by means of an internal combustion engine and an electric machine supplied with power from a rechargeable electrical energy storage system is sometimes referred to as a plug-in hybrid electric vehicle (PHEV). A plug-in hybrid electric vehicle normally uses an energy storage system with rechargeable battery cells which can be charged through a connection to an external electric power supply. During charging, a high amount of energy is fed into the energy storage system in a relatively short time in order to obtain fuel savings and to optimize the vehicle's range of driving.

For this reason, the actual charging of the energy storage system is suitably implemented through a process in which a control unit on the vehicle requests for a charging process to be carried out by means of an external electric power supply. This is carried out after the energy storage system and the external power supply have been electrically connected by means of suitable connector elements.

In the field of automotive technology, an energy storage system normally comprises a battery pack with a large number of battery cells. Using a plug-in hybrid vehicle as an example, a battery pack may for example be of the lithium-ion type. In the event that a 600 V lithium-ion battery pack is used, approximately 200 battery cells connected in series will then be needed to achieve a desired voltage in order to operate the vehicle. The available range for driving the vehicle depends on certain parameters such as the state of charge (SOC) of the battery pack.

Furthermore, it is known that batteries degrade over time and that the expected driving range and fuel savings of a vehicle cannot be upheld towards the end of the lifetime of a battery due to a decreasing performance of the battery. Also, the decreasing performance will affect the magnitude of the power which can be received and supplied by the battery.

Even though rechargeable batteries are capable of being repeatedly recharged and reused many times, it is still a fact that they have a limited lifetime. The point in time in which a battery approaches and finally reaches its "end of life" phase (EOL) can be said to correspond to a time when the performance requirements of the battery are no longer met. Consequently, there is a need for systems and methods for optimizing the lifetime of a rechargeable battery while considering the fact that it will eventually degrade and reach its end of life.

It is also known to use a battery management system in a vehicle in order to ensure safe operating conditions of the vehicle. In such a battery management system, there could be provided a sensor arrangement which is configured for measuring one or more parameters indicating the operation of the battery, for example in the form of a voltage sensor for each battery cell in order to measure the cell terminal voltage for each cell. Such a sensor arrangement could then be used for detecting various parameters related to the operation of the battery.

The patent document U.S. Pat. No. 8,773,066 teaches a system and method for extending the effective lifetime of a vehicle battery pack. The method comprises a step of operating the battery pack in a lifetime-extending storage mode during certain time periods, said storage mode being arranged for charging the battery pack to a lifetime-prolonging state of charge (SOC) which is less than the full state of charge in each charging session.

Furthermore, the patent document US 2014/079967 teaches a method and system arranged for the purpose of recovering a deteriorated output performance. Said method comprises a step of extending the lifetime of the battery pack by heating it during an over-discharge process.

Although there exist known systems and methods which are directed towards prolonging the lifetime of a vehicle battery pack, there is still a desire for more effective solutions within this field of technology.

Consequently, it is desirable to provide an improved method and system for optimizing the expected operating lifetime of an energy storage system, in particular for a battery pack for use within the vehicle industry, for solving the problems associated with prior solutions, in particular problems relating to a reduced power delivery capacity for the battery close to its end of life.

According to a first aspect of the invention, a method is provided for optimizing the operating lifetime of an energy storage system comprising a battery pack with a plurality of battery cells. The method comprises: measuring the temperature of the battery pack by means of a sensor unit; and measuring at least one further parameter representing an indication of the operating lifetime of the battery pack. Furthermore, the method comprises the steps of: detecting whether said parameter reaches a predetermined threshold value indicating that said battery pack is in a condition close to an end of its expected operating lifetime; and, in the event that said threshold value is reached, initiating heating of said battery pack, thereby increasing the temperature of said battery pack to a predetermined value so as to prolong said operating lifetime of the battery pack.

The invention provides certain advantages, in particular when the battery pack is about to reach its end of life, i.e. when the performance of the battery pack is decreasing. Due to the above-mentioned step of heating the battery pack, the internal resistance of the battery cells will be reduced, which leads to an increased power capacity of the battery pack. By decreasing the internal resistance at a suitable point in time when it has been detected that the power requirements are about to be insufficient, the operating lifetime can in fact be prolonged. In other words, the battery pack will then be able to meet the performance requirements for an additional period of time, as compared with a case in which no heating is initiated.

Generally, the invention is also based on the knowledge that the internal resistance of the battery cells increases as it ages. This also means that the power capacity of the battery pack decreases during said ageing process, i.e. the battery pack will have a reduced power capacity towards the end of its operative lifetime. However, by initiating heating of the battery pack at a stage when it is determined that the battery pack is in a condition close to an end of its expected operating lifetime, the internal resistance of the battery cells will be decreased. This means that the power capacity will increase for a further period of time. In this manner, the aim of the invention, i.e. to increase the operating lifetime of the battery pack, can be achieved.

It should be noted that the lifetime of the battery pack will in fact be shorter than a nominal lifetime if a heating process is initiated from start of its lifetime (due to the fact that heating increases the ageing processes of the battery cells), and for this reason it is important to initiate the increase in temperature as late in the life as possible and only to the extent to fulfill the power requirements of the battery pack.

According to a second aspect of the invention, a system is provided for optimizing the operating lifetime of an energy storage system comprising a battery pack with a plurality of battery cells. The system comprises a sensor unit for measuring the temperature of the battery pack and at least one further parameter representing an indication of the operating lifetime of the battery pack. Furthermore, the system comprises a control unit and a heating unit associated with said battery pack, wherein said control unit is configured for detecting whether said parameter reaches a predetermined threshold value indicating that said battery pack is in a condition close to an end of its expected operating lifetime; and also, in the event that said threshold value is reached, for initiating said heating unit for heating said battery pack, thereby increasing the temperature of said battery pack to a predetermined value so as to prolong said operating lifetime of the battery pack.

Further advantages and advantageous features of the invention are disclosed in the following description and in the dependent claims.

BRIEF DESCRIPTION OF THE DRAWINGS

With reference to the appended drawings, below follows a more detailed description of embodiments of the invention cited as examples.

FIG. 3 is a flowchart illustrating the operation of an embodiment of the invention.

DETAILED DESCRIPTION

Different aspects of the present disclosure will be described more fully hereinafter with reference to the enclosed drawings. The method and system disclosed herein can, however, be realized in many different forms and should not be construed as being limited to the aspects set forth herein.

Generally, an embodiment will now be described which aims at optimizing the operational lifetime of an energy storage system in a vehicle, in order to maintain the required power to an electric machine in the vehicle for a prolonged period of time.

In the context of this disclosure, the term "end of life" is used to describe a phase of operation of a battery pack in which it can no longer meet the required performance requirements, alternatively a phase in which it can no longer supply the required energy or power for operating an electric machine in said vehicle. In other words, the required energy or power is less than a pre-determined threshold level. As will be described in detail below, this "end of life" phase can be detected by measuring at least one suitable parameter which indicates that the end of life phase has been reached or will be reached shortly.

Figure 1:
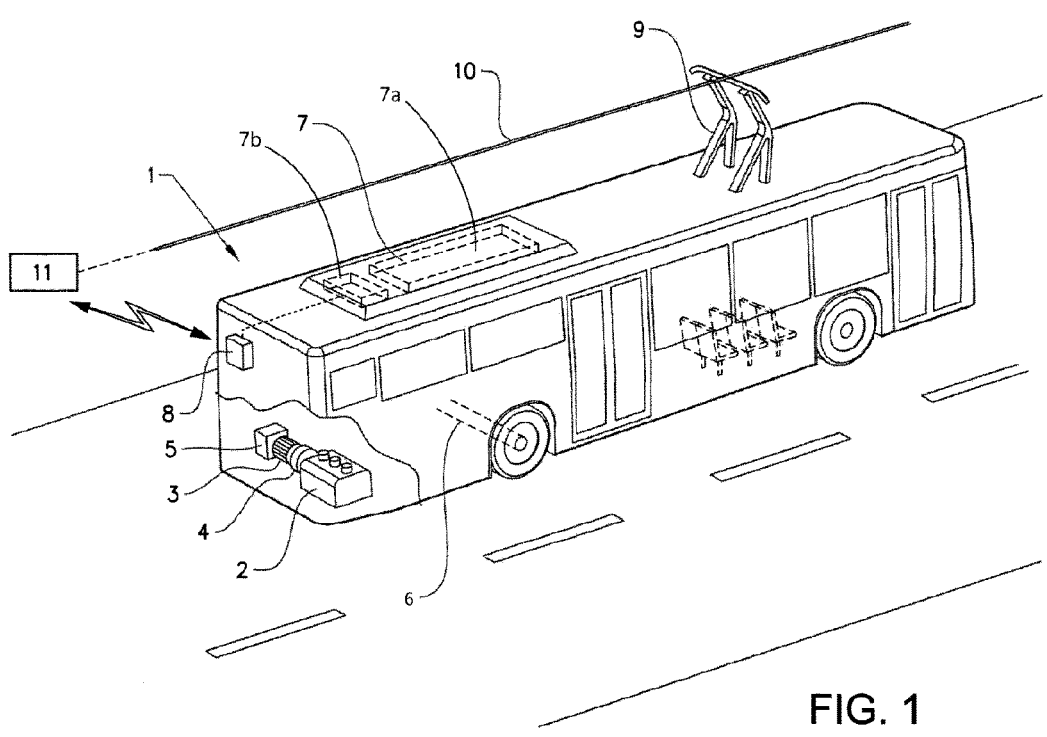
FIG. 1 shows a schematical view of a hybrid vehicle in the form of a bus, in which the present invention can be used.

With initial reference to FIG. 1, there is shown a simplified perspective view of a vehicle in the form of a bus 1 which according to the embodiment is of the so-called plug-in hybrid type which is equipped with an internal combustion engine 2 and an electric machine 3 which are connected to each other via a clutch 4. Both the internal combustion engine 2 and the electrical machine 3 can be used to drive the bus 1. The electric machine 3 is connected to a gearbox 5, which in turn is connected to a rear axle 6 of the bus 1. In a manner which is known as such and therefore not described in detail, the internal combustion engine 2 and the electric machine 3 can be used for driving the rear axle 6. According to the embodiment, the electric machine 3 is used as a combined electric drive motor and generator, and is suitably also used as a starter motor for the internal combustion engine 2.

The bus 1 carries an electric energy storage system 7 which comprises a battery pack 7a which in turn comprises a plurality of battery cells (not shown in detail in FIG. 1). The battery cells are connected in series to provide an output DC voltage having a desired voltage level. Suitably, the battery cells are of lithium-ion type, but other types may in principle also be used.

The energy storage system 7 also comprises a sensor unit 7b which is arranged for measuring one or more predetermined parameters which are indicative of the state of operation of the battery pack 7a. According to an embodiment, the sensor unit 7b can be configured for measuring the voltage of the battery pack 7a and each individual battery cell. Furthermore, the sensor unit 7b can be configured for measuring an alternative parameter, such as the battery current and the temperature of each the battery pack 7a and each individual battery cell. Also, the sensor unit 7b can be used for measuring further signals which are related to the status of the performance, in terms of its power, capacity or other suitable parameters, of the battery pack 7a. As will be described in detail below, the parameter or parameters measured by means of the sensor unit 7b can be used for controlling a process which is adapted for prolonging the operational lifetime of the battery pack 7a.

According to an embodiment, the energy storage system 7 is arranged on the roof of the bus 1, as indicated in FIG. 1. The above-mentioned components of the propulsion system of the bus 1, including the energy storage system 7, are connected to a vehicle control unit 8.

Even though this disclosure refers to a battery pack 7a used in a vehicle 1 in the form of a bus, it can be applied in virtually any type of vehicle which has an energy storage system comprising a battery pack with a number of battery cells. For example, the invention can be applied in hybrid electric vehicles (HEV), full electric vehicles (FEV), battery electric vehicles (BEV), plug-in hybrid vehicles (PHEV) and other forms of vehicles using batteries. The invention can also be used in marine vessels and applications involving power plants and other situations in which battery packs of the above-mentioned type are used.

During certain modes of operation of the bus 1, it is suitable to use the electric machine 3 for operating the bus 1. This means that the energy storage system 7 will deliver power to the electric machine 3, which in turn is driving the rear axle 6. The manner in which an electric machine and an internal combustion engine can be combined and used for operating a vehicle is generally previously known and for this reason, it is not described in any greater detail here.

The bus 1 is equipped with a first electric connector element 9, suitably in the form of a pantograph, which is arranged for being connected to a second electric connector element 10 in the form of an overhead electrical conductor wire which forms part of an external power supply 11.

An embodiment of the invention will now be described in greater detail with reference to FIG. 2, which is a simplified schedule of the battery pack 7a and associated components of the vehicle 1. All components shown in FIG. 1 are not shown in FIG. 2.

As explained above, the battery pack 7a comprises a number of battery cells C1, C2, C3, . . . etc. (also referred to with reference "C") which according to an embodiment is suitably in the magnitude of 200 cells, although the specific number may vary. According to an embodiment, the battery cells are of the lithium ion type, although the principles of the invention are equally applicable to other types of battery cells.

The battery pack 7a is connected to the electric machine 3 and is configured for operating said electric machine 3 (which in turn operates the vehicle 1). Furthermore, the battery pack 7a is connected to the sensor unit 7b, which in turn is connected to the control unit 8.

As mentioned above, the invention is configured for optimizing the expected operating lifetime of the battery pack 7a. Generally, the lifetime of the battery pack 7a is limited, and in order to optimize its performance it is desired to obtain as long lifetime as possible. The invention is particularly applied at a stage when the performance requirements of the battery pack 7a are no longer met, i.e. corresponding to a situation in which it can no longer supply the required energy or the required power in order to operate the electric machine.

To this end, and according to an embodiment, the sensor unit 7b is configured for measuring the temperature of the battery pack 7a and also for measuring at least an additional parameter which represents an indication of the operating lifetime of the battery pack 7a. In the following, this additional parameter is referred to with the letter P. According to an embodiment, such an additional parameter P corresponds to the voltage U of each battery cell. Consequently, the sensor unit 7b is configured for measuring the terminal voltage U for each battery cell C and for transmitting information related to the measured voltage values to the battery control unit 8. Using this information, the control unit 8 may determine whether the battery pack 7a is about to reach its "end of life" phase.

According to a further embodiment, the parameter P can be in the form of the impedance of each battery cell C, which may be used for indicating when the "end of life" phase of the battery pack 7a occurs. According to a further alternative, the parameter P may correspond to a mathematical prediction model using various input signals and parameters and configured for estimating when the "end of life" phase of the battery pack 7a occurs.

As mentioned above, the temperature of the battery pack 7a is measured. The most representative position for measuring the temperature would be inside a battery cell. However, due to the fact that it is difficult to measure the temperature in such a position, a representative set of one or more temperature sensors can be placed (in a manner which is not shown in the drawings) on the cell surface, on the cell tabs, on the busbars or may be in the form of an internal ambient temperature of the cells. This is done in order to ensure to cover the hotspots for safety reasons and also to define a representative average battery cell temperature.

Figure 2:
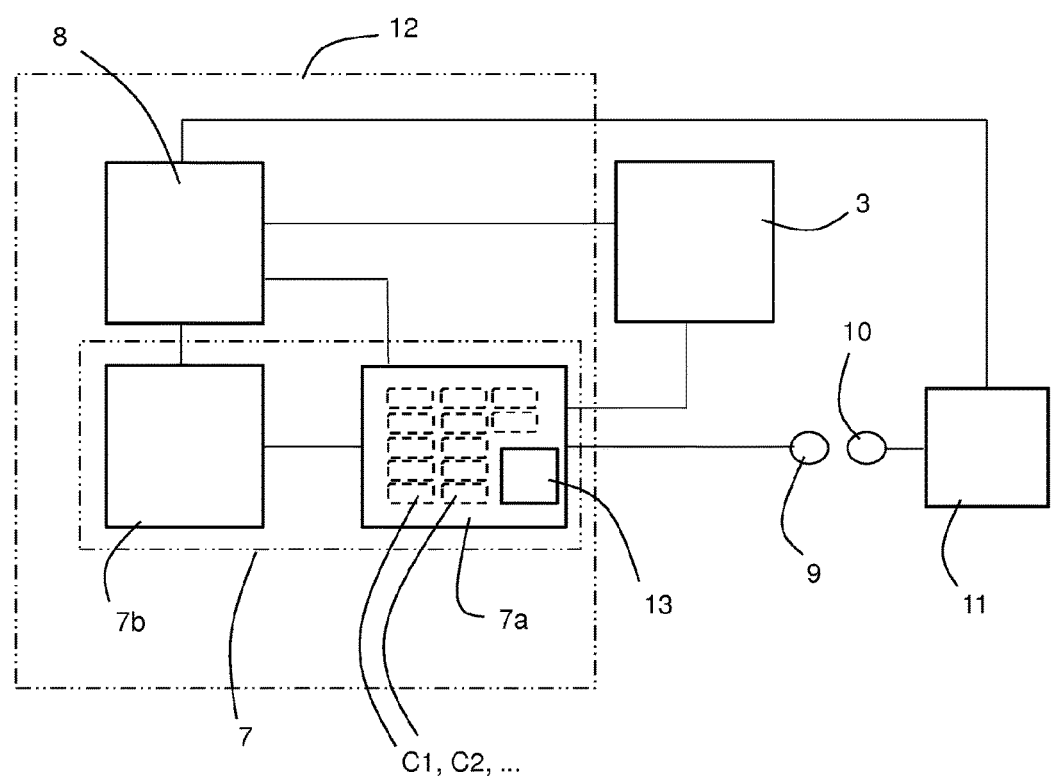
FIG. 2 is a schematic view of an energy storage management system for a vehicle, in accordance with an embodiment of the invention.

FIG. 2 also shows in a schematical manner the first connector 9, forming part of the vehicle, and the second connector 10, forming part of the external power supply 11. Also, the battery pack 7a, the sensor unit 7b and the control unit 8 constitute an energy storage management system 12 which is arranged for monitoring the status of the battery pack 7 and its cells C, in particular as regards the temperature T and battery cell voltage U.

Within the context of this disclosure, there are three main objectives of the energy storage management system 12; firstly, to provide an estimation of parameters such as the temperature T of the battery pack 7a and the voltage of each battery cell C; secondly, to determine whether the battery pack 7a approaches its end of life; and thirdly, to initiate a process of heating of the battery pack 7a in order to prolong the operating lifetime of the battery pack 7a when it approaches a condition in which it is close to said end of life.

As mentioned, the sensor unit 7b is arranged for detecting the voltage U of all the battery cells C forming part of the battery pack 7a and for transmitting this information to the control unit 8. Furthermore, according to the embodiment, the control unit 8 is arranged for detecting whether at least one of the battery cells C has a voltage which is close to, or has reached, a pre-determined voltage value U1 which corresponds to a condition of the battery pack 7a in which it cannot meet the performance requirements or supply the required power and that, for this reason, it can be considered to be approaching its end of life phase. The voltage of a battery cell C can alternatively be expected to be within a certain pre-determined interval, and if the voltage reaches a value which is higher than the upper limit value of said interval or reaches a value which is lower than the lower limit value of said interval, this is also an indication that a threshold value has been reached.

In the event that the control unit 8 should register that a threshold value U has been reached by at least one of the battery cells C (or that the voltage of any cell C is outside its expected voltage interval), the control unit 8 is configured for activating a heating unit 13 which is situated in, or close to, the battery pack 7a. At this stage, the heating of the battery pack 7a will act so as to prolong the lifetime of the battery pack 7a.

According to an embodiment, the heating unit 13 is arranged for heating a coolant media which normally is a fluid (for example water or another media such as gas). The coolant media can also be air.

The heating unit 13 is suitably implemented in a form which depends on which media is used. According to an embodiment, the heating unit 13 is an electric heater which is powered by means of electric power from the battery pack 7a.

According to an embodiment, the heating of the battery pack 7a is carried out in a manner in which its temperature T is increased to a pre-determined value T1 which is chosen to a value which gives an optimal extension of the lifetime of the battery pack 7a. Purely as an example, the heating unit 13 can be configured for raising the temperature of the battery pack 7a from approximately 25° C. to approximately 35° C. The temperature increase is carried out in a manner in which safety limitations for the battery pack 7a are taken into consideration. Suitably, the temperature increase is carried out relatively slowly and stepwise (for example, one degree at a time). With such a process of increasing the temperature T, the lifetime of the battery pack 7a can be prolonged with approximately 10%.

The invention is based on the insight that the above-mentioned heating should be initiated when the battery pack 7a is close to reaching its end of life, but not substantially before such a point in time. Heating of the battery pack 7a will generally cause the internal resistance of the battery cells C to decrease. This means that the battery pack 7a has a higher power capability at a higher temperature. However, the ageing processes of the battery pack 7a are generally increasing with an increasing temperature. The invention therefore relies on an insight that the heating process should not be initiated too early, i.e. it should not be initiated until the battery pack 7a is close to its end of life since, otherwise, a heating of the battery pack 7a at a relatively early stage during its lifetime will have a negative impact on the ageing of the battery pack 7a. In summary, the increase in temperature shall be introduced as late as possible to optimize the lifetime of the battery pack 7a by using a lower optimal temperature as long as possible. As long as the requested power or energy can still be delivered by the battery pack 7a, no increase of the temperature should be initiated. Still, it should be ensured that the limits of lifetime-dependent parameters should not be passed.

Furthermore, the battery cells C should be used within a defined voltage range in order to avoid damage to the cells. When a current is applied to the battery pack 7a, the cell voltage rises due to its internal resistance (according to $U=R*I$), and when the current is withdrawn, the cell voltage decreases. As the battery pack 7a ages and its resistance increases, the voltage response for the same current will be higher and higher. At some point in life the voltage response will reach the cell voltage limits when currents corresponding to the required power are applied or withdrawn. At this point in life the required power requirements can no longer be met. This is a suitable point in time to apply the heating of the battery pack 7a as described above.

According to an embodiment, the battery cell voltages U are measured and the temperature of the battery pack 7a is increased when the battery cell with the largest voltage response is close to, or has reached, its cell voltage limit. As described above, the resistance of the battery cells C will thereby decrease and the point in time when the battery pack 7a no longer can deliver its required power will be moved forward in time. This also means that the lifetime of the battery pack 7a will be extended.

The reason for not increasing the temperature from an early stage in the lifetime of the battery pack 7a is consequently that the ageing processes are accelerated with an increasing temperature.

As mentioned above, there is a desire to arrange the sensor unit 7b (see also FIGS. 1 and 2) so as to provide a measurement of at least one parameter which reflects the state of operation of the battery pack 7a. According to an embodiment, there is provided a measurement of the voltage U of each battery cell C by means of said sensor unit 7b. According to alternative embodiments, the sensor unit 7b may be configured for measuring other parameters than the battery cell voltage as indicators of the state of operation of the battery pack 7a. Purely as examples, such parameters can be the battery output power or the energy of the battery pack 7a. Both these parameters can be used for controlling whether the battery pack 7a is about to reach its end of life.

FIG. 3 shows a flow chart with the main steps of the proposed method. First, the method begins by obtaining measurements from the temperature sensor in the sensor unit 7b (see step 14 in FIG. 3). Next, measurements from a further parameter, which according to an embodiment is the battery cell voltage, is also obtained be means of the sensor unit 7b (step 15).

The next stage in the process is that the control unit 8 is configured for determining whether a threshold value for the battery cell voltage has been reached for at least one of the battery cells C (or that the voltage of any cell C is outside its expected cell voltage interval) (step 16 in FIG. 3). If this is the case, the control unit 8 will initiate the heating unit 13 and the temperature of the battery pack 7a will be increased, as described above. As a result, the remaining lifetime of the battery pack 7a during which it may supply sufficient power will be extended.

It is to be understood that the present invention is not limited to the embodiments described above and illustrated in the drawings; rather, the skilled person will recognize that many changes and modifications may be made within the scope of the appended claims.

For example, although the battery cell terminal voltage U is normally used as a relevant parameter P, other parameters may also be measured by means of the sensor unit, such as the temperature of the battery cells C or the battery current.

According to further embodiments, it is possible to use the actual resistance and the capacity of the battery cells C. Also, prediction models can be used in order to estimate such parameters. In this manner, it would be possible to determine in an accurate manner an optimum point in time in which the heating should be initiated.

Also, as an alternative to measuring for example the battery cell voltage, different types of prediction models can be utilized for determining when the end of life of the battery pack 7a is approaching.

The invention claimed is:

1. Method for optimizing an operating lifetime of an energy storage system comprising a battery pack with a plurality of battery cells, the method comprising:

measuring a temperature of the battery pack by a sensor unit;

measuring at least one further parameter in the form of a terminal voltage of each of the battery cells, representing an indication of the operating lifetime of the battery pack;

detecting whether the further parameter reaches a predetermined threshold value corresponding to a battery cell limit voltage indicating that the battery pack is in a condition close to an end of its expected operating lifetime;

selecting the threshold value to correspond to end limits of a voltage interval of each of the battery cells and representing a condition of the battery pack in which it cannot be expected to meet pre-determined performance requirements related to the power or energy supplied by the battery pack, and after the threshold value is reached, initiating heating of the battery pack, thereby increasing the temperature of the battery pack to a predetermined value.

2. Method according, to claim 1, wherein the method farther comprises:

measuring the further parameter in the form of the impedance of battery cells.

3. Method according to claim 1, wherein the method further comprises:

using the further parameter in the form of a prediction model for determining when the battery pack reaches a condition in which it cannot be expected to meet pre-determined performance requirements related to the power or energy supplied by the battery pack.

4. A computer comprising a computer program for performing the method steps of claim 1 when program is run on the computer.

5. A non-transitory computer readable medium carrying a computer program for performing the steps of claim 1 when program is run on a computer.

6. A control unit for optimizing the operating lifetime of an energy storage system, the control unit being configured to perform the steps of the method according to claim 1.

7. System, for optimizing an operating lifetime of an energy storage system comprising a battery pack with a plurality of battery cells, the system comprising a sensor unit for measuring a temperature of the battery pack and at least one further parameter representing an indication of the operating lifetime of the battery pack, and a control unit and a heating unit associated with the battery pack, wherein the control unit is configured for detecting whether the further parameter reaches, a predetermined threshold value corresponding to a battery cell limit voltage indicating that the battery pack is in a condition close to an end of its expected operating lifetime, the threshold value being selected to correspond to end limits of a voltage interval of each of the battery cells and representing a condition of the battery pack in which it cannot be expected to meet pre-determined performance requirements related to the power or energy supplied by the battery pack, and also, after the threshold value is reached, for initiating heating unit for heating the battery pack, thereby increasing the temperature of the battery pack to a predetermined value.

8. A vehicle comprising a system according to claim 7.

* * * * *